United States Patent [19]

Binkley

[11] Patent Number: 5,396,187

[45] Date of Patent: Mar. 7, 1995

[54] AMPLITUDE-AND RISE-TIME-INSENSITIVE TIMING-SHAPING FILTERS

[75] Inventor: David M. Binkley, Knoxville, Tenn.

[73] Assignee: CTI Pet Systems, Inc., Knoxville, Tenn.

[21] Appl. No.: 929,687

[22] Filed: Aug. 13, 1992

[51] Int. Cl.⁶ .............................................. H03K 5/153
[52] U.S. Cl. ................................... 327/552; 327/317
[58] Field of Search .................. 328/167, 163, 165; 307/520, 529

[56]     References Cited
U.S. PATENT DOCUMENTS

| 4,204,170 | 5/1980 | Kage | 328/165 |
| 4,424,462 | 1/1984 | Gay | 307/520 |
| 4,443,768 | 4/1984 | Nowlin | 328/167 |
| 4,697,098 | 9/1987 | Cloke | 328/163 |
| 4,918,402 | 4/1990 | Voorman et al. | 307/520 |

OTHER PUBLICATIONS

Nowlin, C. H., "Low–Noise Lumped–Element Timing Filters with Rise–Time Invariant Crossover Times," *Rev. Sci. Instrum.*, 63 (4), Apr. 1992, pp. 2322–2326.
Turko, B. T., et al., "A Precision Timing Discriminator for High Density Detector Systems," *Conference Record of the 1991 IEEE Nuclear Science Symposium and Medical Imaging Conference*, Nov. 2–9, 1991, pp. 711–715.

*Primary Examiner*—Andrew M. Dolinar
*Attorney, Agent, or Firm*—Pitts & Brittian

[57]     ABSTRACT

An amplitude- and rise-time-insensitive timing-shaping filter (10) for converting a selected input signal into a bi-polar output signal having a zero-crossing point which is independent of the rise-time and amplitude of substantially linear-edge input signals, and which is amplitude insensitive for input signals of arbitrary fixed shapes. The amplitude- and rise-time-insensitive timing-shaping filter (10) includes an attenuator (14) for generating an attenuated signal, a delay path (12) for generating a delay signal, and a differencer (16) for subtracting the attenuated signal from the delayed signal. The delay path (12) of the present invention includes a low-pass filter of a selected order and configuration, an all-pass filter with a selected order and configuration, or an all-pass-low-pass filter combination for generating a delayed signal.

8 Claims, 9 Drawing Sheets

AMPLITUDE- AND RISE-TIME-INSENSITIVE TIMING-SHAPING FILTERS

TECHNICAL FIELD

This invention relates to the field of electrical filters. More specifically, this invention relates to circuits used to filter input signals to provide timing signals which are insensitive to input-signal amplitude for input signals of fixed shape. The filter circuits of the present invention are insensitive to input-signal rise time and amplitude for linear-edge signals.

BACKGROUND ART

It is well known, when measuring time of occurrence of input signals, that timing discriminators are typically required in high resolution time measurement techniques. It is desired that these discriminators accurately mark the time arrival of the input signals without respect to their intensity or their specific shapes. Constant-fraction discriminators or leading-edge discriminators are typically used. In the event of a bi-polar input signal, zero-crossing discriminators may be used.

The circuit of the constant-fraction discriminators defines two paths. The first is an attenuator path and the second a delay path. The attenuator path acts to reduce the amplitude of the input signals by a selected amount. The delay path does not alter the amplitude of the signal, but delays the arrival of the signal to a differencer. The differencer will then essentially subtract the attenuated signal from the delayed signal. The result will be a wave form having an initial negative value and then crossing the x-axis (y=zero) and going positive. This crossing is referred to as the zero-crossing. Signals that define similar waveforms but have differing amplitudes will each define substantially the same zero-crossing. Therefore, the discriminator is amplitude insensitive.

Delay lines of the constant-fraction discriminator which are typical of the prior art include the use of a selected length of cable. The length of cable simply delays the signal due to the length of travel the signal must traverse to reach the differencer. The length of cable is selected by determining the delay per linear unit and dividing that number into the desired delay time. A delay of 7.5 ns using a cable having a 1.5 ns per ft delay would obviously require 5.0 ft of cable. The cable is typically coiled up to minimize the required space. However, it is well known that this type of delay line usually requires more space than is desired. Further, if the delay time is to be altered, a cable of a length corresponding to the desired delay time must be installed. Therefore it is evident that a supply of delay lines, each defining a unique length, must be maintained.

U.S. Pat. No. 4,443,768 issued to C. H. Nowlin on Apr. 17, 1984 discloses a filter for converting an input pulse having random amplitudes and non-zero rise times to a bi-polar output pulse having a zero-crossing time that is independent of the rise time and the amplitude of the input pulse. In order to accomplish the desired output, the Nowlin filter replaces the delay line with a differentiator. The circuit operates by differencing an attenuated version of the signal with a differentiated version. The requirement of timing along the leading edge of a linear-edge input signal is also necessary for amplitude-rise-time-compensated timing using the delay-line constant-fraction discriminator. The Nowlin shaping-signal zero-crossing time is insensitive to input-signal amplitude for non-linear-edge input signals of fixed, arbitrary shape.

The simplest implementation of the Nowlin circuit consists of a single-pole high-pass filter, acting as an approximate differentiator, combined with an attenuation and differencing circuit. The leading edge of the input signal is described in the time and Laplace domain as:

$$V_{in}(0 \le t \le t_r) = (V_{inpk}/t_r)t$$

and $$V_{in}(s) = (V_{inpk}/t_r)(1/s^2)$$

where $V_{inpk}$ is the peak input-signal amplitude (occurring at $t=t_r$) and $t_r$ is the input-signal linear-edge rise-time. The transfer function for the Nowlin constant-fraction discriminator is given by:

$$H_{cf}(s) = f\{(1-st_d)((1-f)/f)\}/(1+St_d)$$

where f is the attenuation gain, and $t_d$ is the time-constant associated with the single-pole high-pass network.

The shaping signal is represented in Laplace notation as the product of the input-signal and the shaping network Laplace expressions, which are the latter two equations, respectively. The time-domain shaping signal is found from the inverse Laplace transform of this product and is given by:

$$V_{cf}(0 \le t \le t_r) = (V_{inpk}/t_r)\{ft - t_d(1 - e^{-t/t_d})\}.$$

This shaping signal starts at the origin (a value of zero at time $t=0$) and must go negative before making a positive-going zero crossing. An initial negative signal swing, or underdrive, requires that the fraction f be less than unity, and a positive-going crossing requires that f be greater than zero. Further, the positive-going zero crossing must occur during the input-signal rise time for linear-edge rise-time-insensitive timing, thereby placing a further restriction on the fraction value. The range of acceptable values are described by:

$$0 < f < 1$$

and $$f \le (t_d/t_r)(1 - e^{-t_r/t_d})$$

where the fraction and single-pole high-pass filter time constant must each be selected based on the smallest expected input-signal rise time. The zero-crossing time occurs when $v_{cf}$ as given above is equal to zero and is found by equating $\{ft - t_d(1 - e^{-t/t_d})\}$ to zero and solving for t. Therefore, it is obvious that the zero-crossing time is insensitive to the input-signal amplitude ($V_{inpk}$) and the rise time ($t_r$).

Though the device of the '768 patent provides a timing-shaping circuit which is amplitude- and rise-time-insensitive, the implementation thereof is not easy in some integrated circuitry. For example, the circuit using a single-pole CR high-pass filter (an approximate differentiator) requires a capacitor with both terminals isolated from ground. Such a capacitor may not be easily implemented in some integrated circuitry.

Other types of discriminators are described by C. H. Nowlin in "Low-Noise Lumped-Element Timing Filters with Rise-Time Invariant Crossover Times", *Rev.*

Sci. Instrum., Vol 63, No. 4, pp. 2322–2326, April, 1992; and B. T. Turko, et al., in "A Precision Timing Discriminator for High Density Detector Systems", IEEE, pp. 711–715, 1992.

The Nowlin article describes lumped-element filters which do not include the use of delay lines or their equivalents. Nowlin is primarily directed toward the theoretical aspects of the relationships between noise-caused timing variances, crossover time, and waveform.

Turko, et al. describes a zero-crossing circuit consisting of a voltage comparator and a single RC integrating network. The circuit shown by Turko, which will sense the peak of a narrow pulse, uses a single-pole low-pass filter with a fraction value of 100%. The fraction value is calculated by dividing the attenuated signal gain by the delayed signal gain. There can be no zero-crossing in this circuit until the input reaches a peak and begins falling as there is no attenuated signal. The response of the Turko circuit is that of a single-pole CR high-pass filter, an approximate differentiator, that approximately senses the peak of the input signal where the input signal slope is zero.

Therefore, it is an object of this invention to provide a means for marking the time arrival of input signals without respect to their intensity or their specific shapes.

Another object of the present invention is to provide such a marking means by using a constant-fraction discriminator which may be contained with integrated circuitry for cost and storage efficiency.

Still another object of the present invention is to provide a constant-fraction discriminator which is insensitive to input signal amplitude and rise time.

Yet another object of the present invention is to provide a constant-fraction discriminator which uses low-pass filter integration techniques or an all-pass filter to achieve a delayed signal for comparison with an attenuated signal.

DISCLOSURE OF THE INVENTION

Other objects and advantages will be accomplished by the present invention which serves to convert a selected substantially linear-edge input signal into a bi-polar output signal having a zero-crossing point which is independent of the rise-time and amplitude of the input signal for time derivation along the substantially linear edge. The present invention is amplitude-insensitive in the case of arbitrary signals with fixed shapes. The amplitude- and rise-time-insensitive timing-shaping filter of the present invention includes a delayed path defined by integrated or discrete circuitry which offers several advantages over standard delay-line shaping circuits. The delayed path of the preferred embodiment of the amplitude- and rise-time-insensitive timing-shaping filter is designed to allow for readily altering the delay time without requiring the storage of a separate and long delay line for each desirable delay time. Further, the circuitry of the amplitude- and rise-time-insensitive timing-shaping filter is less space-consuming than standard delay lines.

The amplitude- and rise-time-insensitive timing-shaping filter includes an attenuation path for reducing the amplitude of the input signal by a selected fraction. A delay path is provided for generating a delayed signal. This function is performed by a low-pass filter of a selected order and configuration, an all-pass filter with a selected order and configuration, or an all-pass-low-pass filter combination.

The attenuated signal is subtracted from the integrated signal to output the desired bi-polar output signal.

BRIEF DESCRIPTION OF THE DRAWINGS

The above mentioned features of the invention will become more clearly understood from the following detailed description of the invention read together with the drawings in which.

BEST MODE FOR CARRYING OUT THE INVENTION

An amplitude- and rise-time-insensitive timing-shaping filter incorporating various features of the present invention is illustrated generally at 10 in the figures. The amplitude- and rise-time-insensitive timing-shaping filter 10 includes a delay path 12 defined by integrated or discrete circuitry which offers several advantages over standard delay-line shaping circuits. The delay path 12 of the preferred embodiment of the amplitude- and rise-time-insensitive timing-shaping filter 10 is designed to allow for readily altering the delay time without requiring the storage of a separate and long delay line for each desirable delay time. Further, the integrated or discrete circuitry of the amplitude- and rise-time-insensitive timing-shaping filter 10 is less space-consuming than prior art constant-fraction discriminators using standard delay lines. These prior art delay lines are not implementable in integrated circuitry.

The objective of timing-shaping filters and the like is to generate a timing point from a set of input signals which have been selectively converted into bi-polar signals, the timing point being that point where the bi-polar signals cross the x-axis. At this point, the magnitude of the signal is zero, and hence is referred to as the zero-crossing point. The zero-crossing point is an indicator as to when the input pulse occurred.

Throughout the discussion of the present invention, references will be made to the amplitude- and rise-time-insensitivity of the amplitude- and rise-time-insensitive timing-shaping filter 10. It is intended that such reference be directed toward the amplitude- and rise-time insensitivity with regard to substantially linear-edge input signals wherein the timing is accomplished along the leading edge thereof. It is further to be understood that such a reference is directed toward the amplitude insensitivity with regard to input signals defining arbitrary yet fixed shapes, wherein rise-time insensitivity is partially accomplished. Amplitude insensitivity, without rise-time insensitivity, is not limited to substantially linear-edge input signals.

Figure 1:
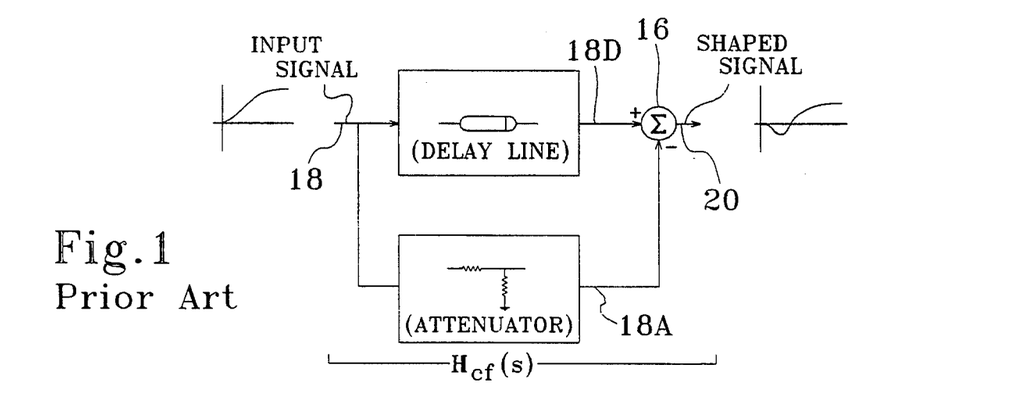
FIG. 1 is a block diagram illustrating a constant-fraction discriminator of the prior art wherein a delay line is incorporated.

A set of input signals 18 is delivered through two branches of the circuitry to be processed. The first branch serves to delay the signal 18 and the second branch to attenuate the signal 18. The delayed and attenuated signals $18_{D,A}$ are then compared with each other to generate the bi-polar signal 20 having at least one zero-crossing. As shown in FIG. 1, a delay-line constant-fraction-discriminator circuit includes a delay line branch and an attenuation branch. The delay line is simply a length of line which defines a particular time delay per unit length. The attenuated signal $18_A$ is subtracted from the delayed signal $18_D$ at a summing device or differencer 16.

Figure 2:
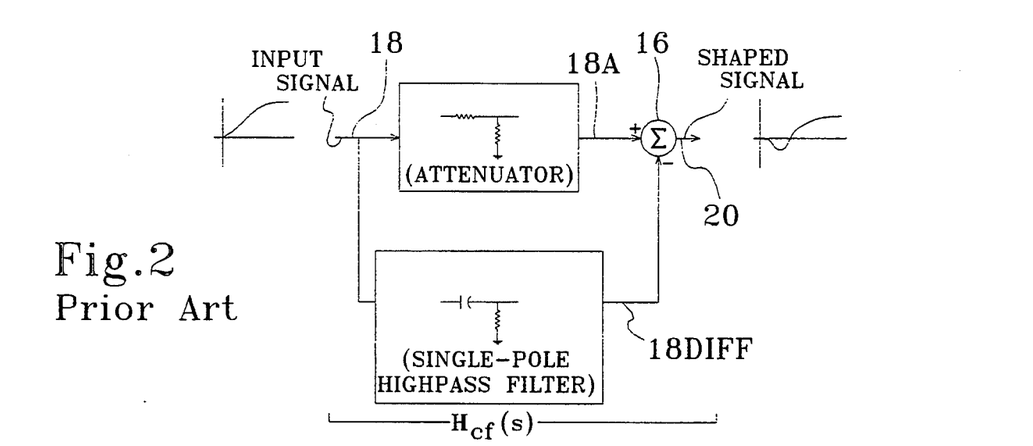
FIG. 2 is a block diagram illustrating a device constructed in accordance with U.S. Pat. No. 4,443,768 issued to C. H. Nowlin on Apr. 17, 1984.

FIG. 2 illustrates, in similar fashion to FIG. 1, the circuitry of the timing-shaping filter of the '768 patent as discussed above. In this embodiment, in order to achieve a positive-going zero-crossing, a single-pole high-pass filter is used to generate an approximate differentiation $18_{DIFF}$ of the input signal 18 which is then subtracted from the attenuated signal $18_A$.

Figure 3:
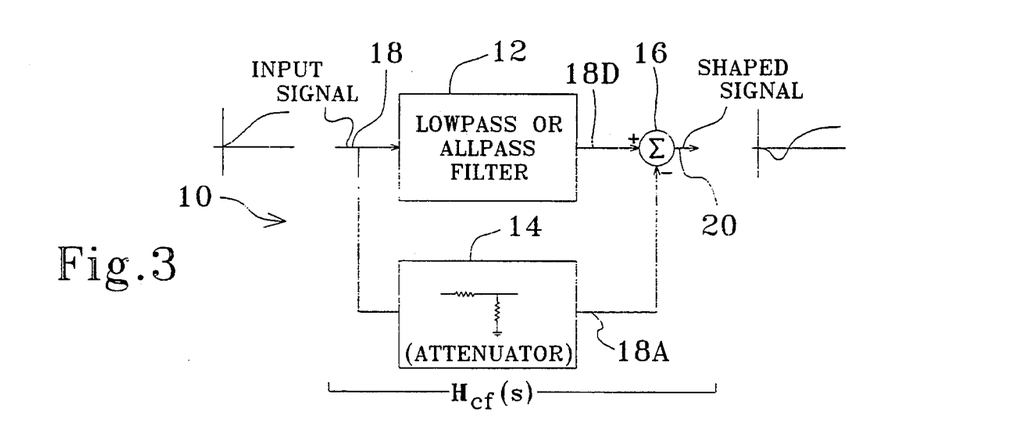
FIG. 3 is a block diagram illustrating the amplitude- and rise-time-insensitive timing-shaping filter constructed in accordance with several features of the present invention.

In the preferred embodiment of the present invention, a delay path 12 is provided to include a low-pass filter, an all-pass filter, or a combination all-pass-low-pass filter. The selected filter 12 serves to generate a delayed signal which, in the case of the low-pass filter, is an approximate integral of the input signal. A typical attenuator 14 is used to derive an attenuated signal $18_A$ which may be subtracted from the delayed signal $18_D$ at the differencer 16.

The functions of the timing-shaping filters may be more easily understood by a review of FIGS. 4A–C and 5A–C, which illustrate the basic steps involved in the generation of the desired bi-polar output signals having zero-crossings from input signals defining substantially linear leading edges. These illustrations are representative of the signals generated by prior art delay-line constant-fraction discriminators. It is desired that these results be approximated in the present invention through the use of integrated or discrete circuitry.

Figure 4A:
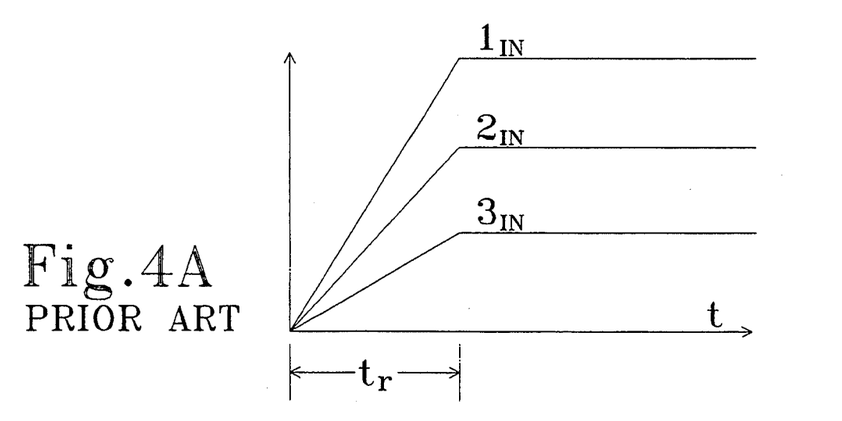
FIG. 4A is a graph of a set of input signals having similar rise-times and varying amplitudes.
Figure 4B:
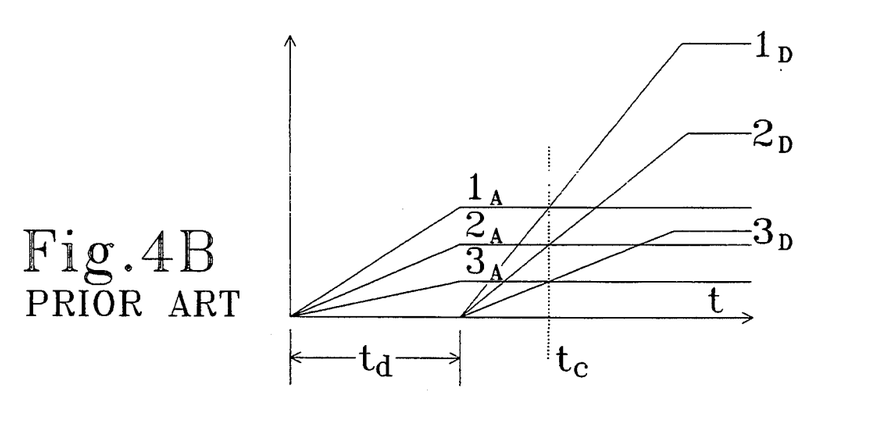
FIG. 4B is a graph of the delayed signals and the attenuated signals produced by a typical delay-line constant-fraction discriminator of the prior art by the processing of the signals of FIG. 4A and superimposed one upon the other.
Figure 4C:
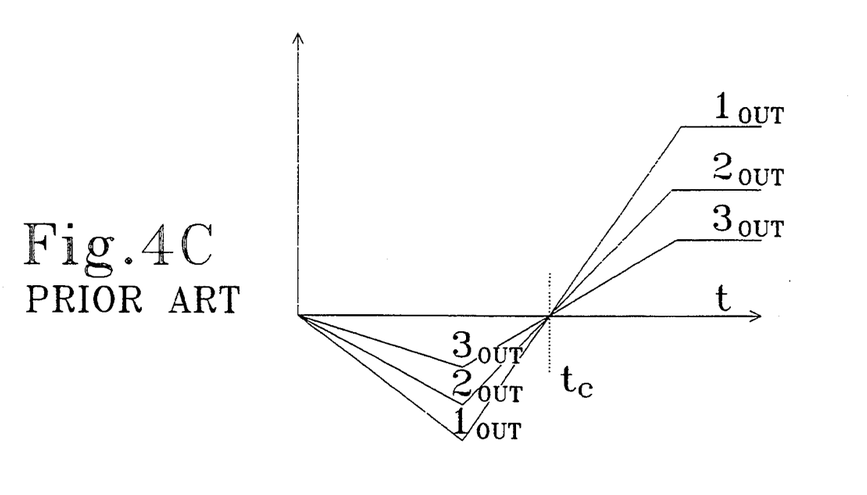
FIG. 4C is a graph of the output signals generated by a typical delay-line constant-fraction discriminator of the prior art by subtracting the attenuated signals of FIG. 4B from the respective delayed signals of FIG. 4B and further showing that each defines substantially the same zero-crossing point.

FIG. 4A illustrates a set of three input pulses, $P_{IN}1-3$, having equal rise times $t_r$. FIG. 4B illustrates the attenuated signals, $P_A1-3$, and the delayed signals, $P_D1-3$. The delayed signals have been delayed by a time $t_d$. FIG. 4C illustrates the resultant bi-polar signals $P_{OUT}1-3$ after the subtraction of the attenuated signals $P_A1-3$ from the delayed signals $P_D1-3$.

It may be seen from FIG. 4B that the respective delayed signals $P_D1-3$ cross the attenuated signals $P_A1-3$ at the same point in time ($t_c$) such that after the subtraction step, each of the output signals $P_{OUT}1-3$ has the same zero-crossing time as illustrated in FIG. 4C. The delayed signal has a magnitude of zero during the interval from $0 < t < t_d$, and therefor the output signals $P_{OUT}1-3$ will define a negative slope, or underdrive, until time $t_d$. The delayed signals $P_D1-3$, defining greater positive slopes than do the attenuated signals $P_A1-3$, will then cause the slope of the output signals $P_{OUT}1-3$ to turn upward and eventually cross the x-axis at time $t_c$, where the respective magnitudes are equal.

The zero-crossing time $t_c$ may be determined by the formula:

$$t_c = t_d + f t_r$$

where f = the fraction of the attenuated signal $P_A1-3$ as compared to the input signal $P_{IN}1-3$. In this case, the delay time, $t_d$, is further limited as follows:

$$t_d > t_r(1-f).$$

Thus, in the illustration of FIGS. 4A–C, the zero-crossing time $t_c$ is dependent upon the rise time $t_r$.

It can be shown mathematically that the shape of individual input signals $P_{IN}$ may be arbitrary so long as the only variable between the individual signals $P_{IN}$ is the amplitude.

Figure 5A:
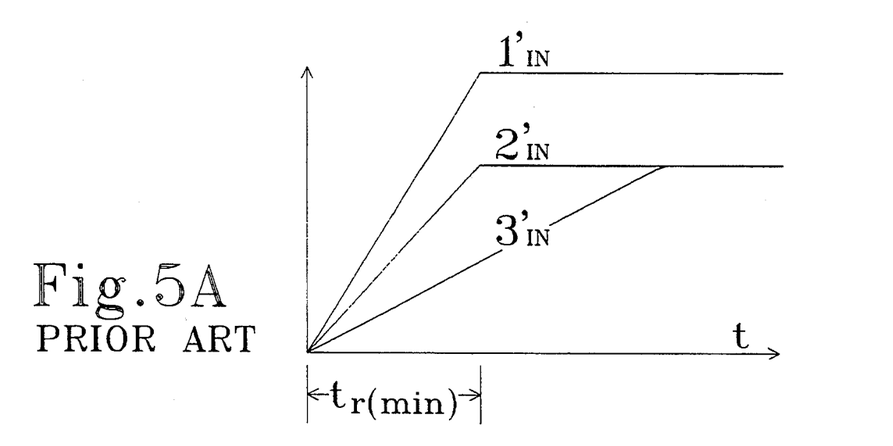
FIG. 5A is a graph of a set of input signals having varying amplitudes and further defining varying rise times.
Figure 5B:
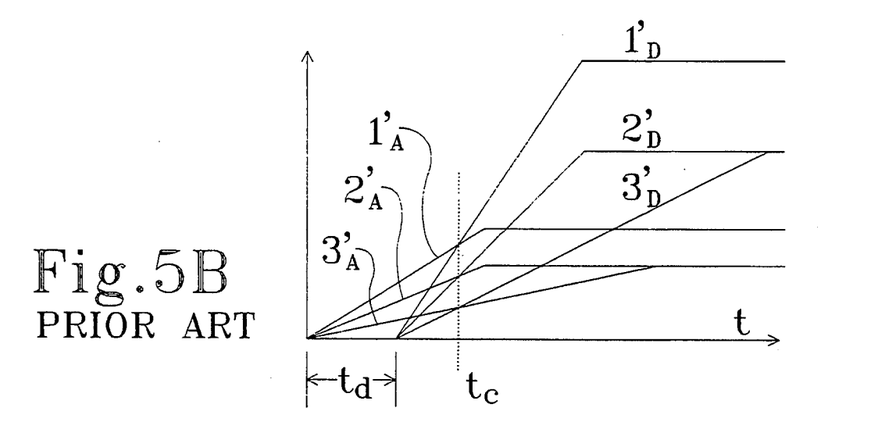
FIG. 5B is a graph of the delayed signals and the attenuated signals produced by a typical delay-line constant-fraction discriminator of the prior art by the processing of the signals of FIG. 5A and superimposed one upon the other.
Figure 5C:
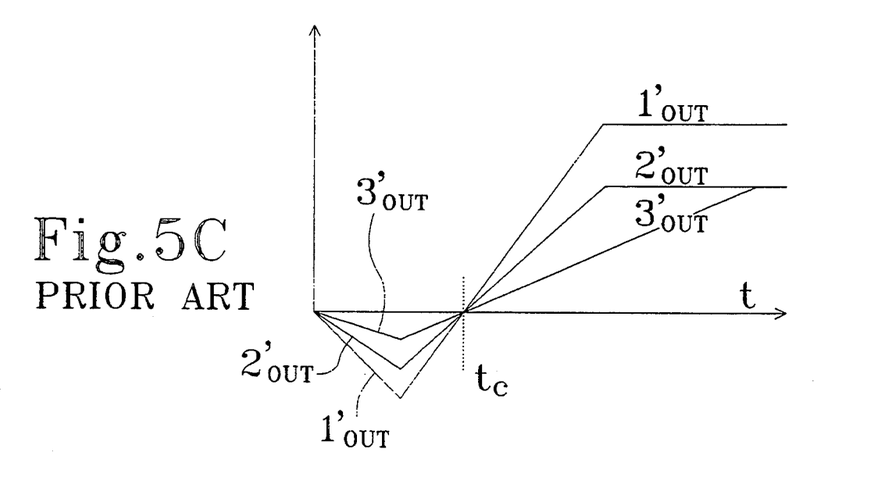
FIG. 5C is a graph of the output signals generated by a typical delay-line constant-fraction discriminator of the prior art by subtracting the attenuated signals of FIG. 5B from the respective delayed signals of FIG. 5B and further showing that each defines substantially the same zero-crossing point.

FIGS. 5A–C illustrate an example of three input signals $P_{IN}1'-3'$ wherein the rise time varies between the first two $P_{IN}1',2'$ and the third $P_{IN}3'$. Further, the amplitude of the first $P_{IN}1'$ is varied from that of the latter two $P_{IN}2',3'$. In this case, the delay time $t_d'$ is further limited as follows:

$$t_d' < t_{r(min)}(1-f)$$

where $t_{r(min)}$ is the minimum rise time of the respective input signals $P_{IN}1'-3'$. With this limitation, the zero-crossing time $t_c'$ will occur prior to $t_{r(min)}$ and will thus provide the same zero-crossing time $t_c'$ for each output signal $P_{OUT}1'-3'$. The zero-crossing time $t_c'$ may calculated as follows:

$$t_c' = t_d'/(1-f)$$

Therefore it can be seen that by limiting the delay time $t_d'$ as indicated, the zero-crossing time $t_c'$ is rise-time-insensitive as well as amplitude-insensitive for substantially linear-edge inputs. As discussed previously, FIGS. 4A–C and 5A–C are illustrative of the prior art delay-line constant-fraction discriminators. Thus, the equations discussed along with the descriptions of the subject figures are applicable specifically in the case of the delay-line constant-fraction discriminators. However, the recited equations may be used as approximations of the desired results in delayed-path circuitry in general.

As illustrated in FIG. 3, the present invention includes a delay path 12 in lieu of the delay line of the prior art delay-line constant-fraction discriminator in order to reduce the required space by providing for generation of a delayed signal $18_D$ as a product of integrated or discrete circuitry. The delay path 12 includes at least one low-pass filter of a selected order, at least one all-pass filter of a selected order, or a combination of both. A linear phase filter has a linearly increasing phase shift with frequency. The group delay (the derivative of the phase response with frequency) of a linear-phase filter is equal to the delay time of the sinusoidal signals for frequencies where the filter exhibits linear phase characteristics. Linear-phase filters may be desirable for some applications, but it is not intended that the present invention be limited to linear-phase filters.

As mentioned, the low-pass filter may be of a selected order. The first-order, or single-pole, low-pass filter response is given in Laplace notation as:

$$H(s) = \omega_n/(s+\omega_n)$$

where $\omega_n$ is the critical frequency associated with the pole. The first-order all-pass filter is synthesized by the addition of a mirror-image right-half-plane zero. The first-order all-pass filter response is given by:

$$H(s) = -\{(s-\omega_n)/(s+\omega_n)\}$$

where negation is present in the expression to permit positive DC gain. As illustrated by this equation, the magnitude response for the first-order all-pass filter is constant with frequency while the phase shift increases with frequency.

The second-order, or two-pole, low-pass filter response is given in Laplace notation as:

$$H(s) = \omega_n^2 / (s^2 + (\omega_n/Q)s + \omega_n^2)$$

where $\omega_n$ is the natural frequency and $Q$ is the quality factor associated with the pair of poles. The second-order all-pass filter is synthesized by the addition of mirror-image right-half-plane zeros. The second-order all-pass filter response is then given by:

$$H(s) = (s^2 - (\omega_n/Q)s + \omega_n^2)/(s^2 + (\omega_n/Q)s + \omega_n^2).$$

Like the first-order all-pass filter, the magnitude response for the second-order all-pass filter is constant with frequency while the phase shift increases with frequency.

Second- and higher-order low-pass filters can be designed for selected responses by the selection of the pole locations. For the case of all-pass filters, mirror-image right-half-plane zeros are also selected. The desired second-order filter response is obtained by the selection of second-order natural frequency ($\omega_n$) and quality factor (Q). Third- and higher-order filters are obtained by cascaded first- and second-order sections. A third-order filter may be obtained by cascading one first-order section and one second-order section. A fourth-order filter may be obtained by cascading two second-order sections. Higher-order filters may be obtained by similar progression of the addition of first- and second-order sections.

Following is a discussion of the testing of an amplitude- and rise-time-insensitive timing-shaping filter be using a two-pole low-pass-filtered step-input signal. The amplitude- and rise-time-insensitive timing-shaping filter 10 used to give delays of one second with a fraction value of fifty percent (50%). This delay is equal to approximately one-half the input signal rise time which is relatively short for constant-fraction operation and corresponds amplitude-rise-time-compensated operation for the delay-line constant fraction discriminator having the typical fraction of twenty percent (20%).

Figure 6:
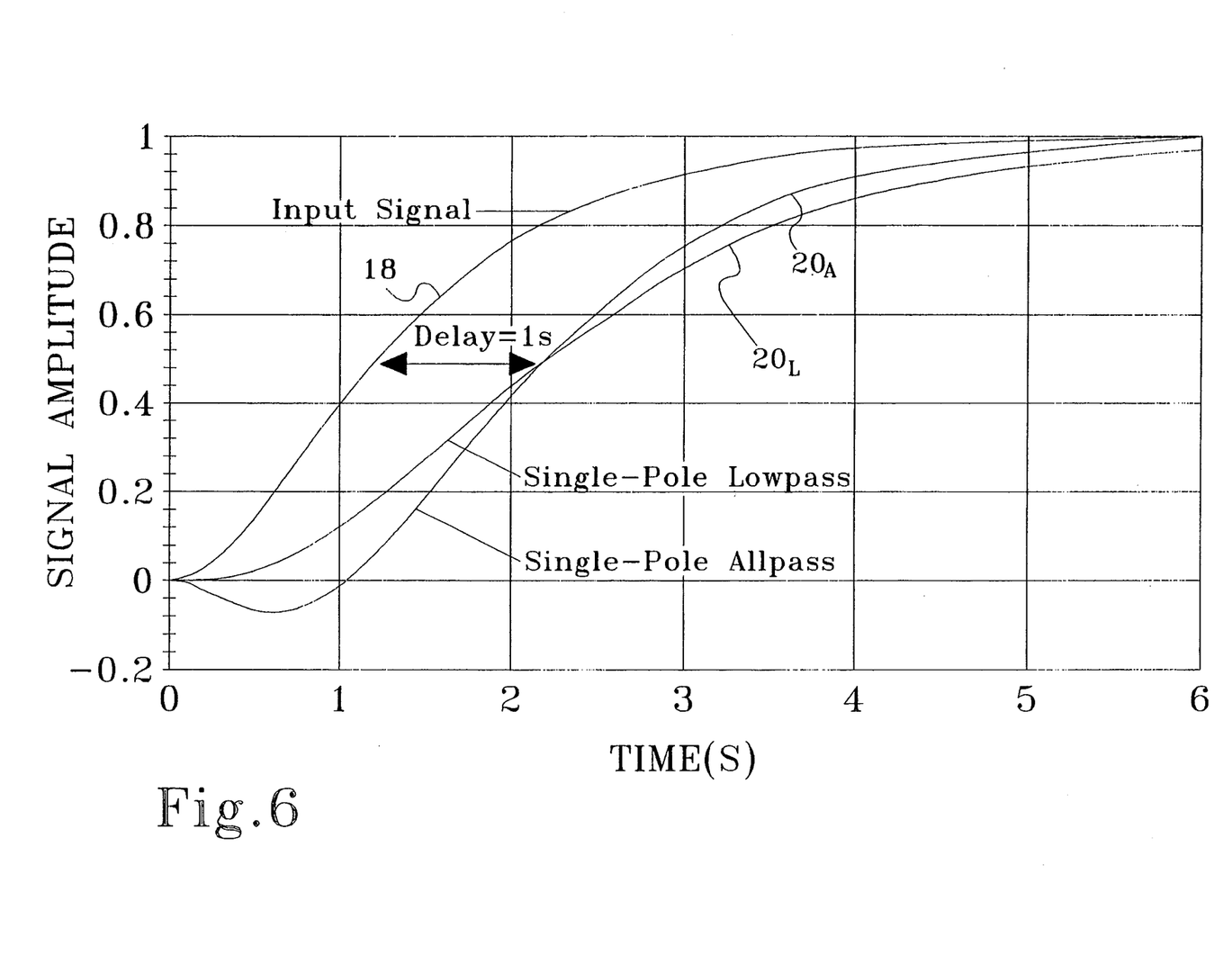
FIG. 6 is a graph illustrating an input signal as compared to output signals of a first-order all-pass filter and a first-order low-pass filter as may be incorporated in the present invention.

The two-pole low-pass-filtered step input and resulting output signals are illustrated in FIG. 6 for the first-order low-pass and all-pass filters 10. Each filter 10 provides a one second signal delay $t_d$. The output signal $20_A$ derived from the all-pass filter defines a slope which is close to that of the input signal 18. The higher slope of the all-pass output signal $20_A$ as compared to that of the low-pass filter is a result of the all-pass filter gain which does not roll off with frequency. The gain of the all-pass filter remains at unity while the gain of the low-pass filter falls off at frequencies above the cutoff frequency until the gain is equal to zero. The higher output slope is advantageous for minimizing timing jitter and comparator walk errors.

Figure 7:
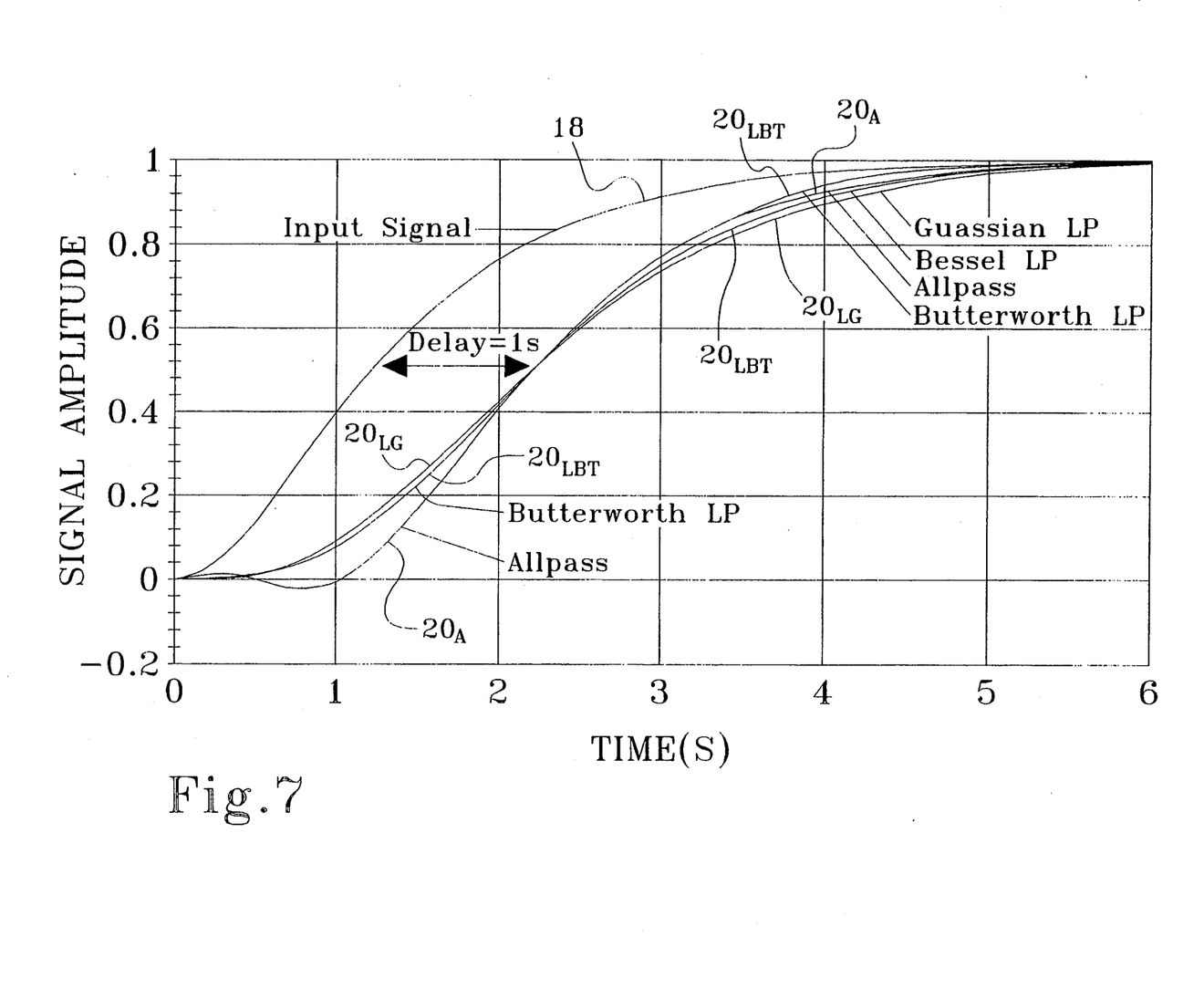
FIG. 7 is a graph illustrating an input signal as compared to output signals of a second-order all-pass filter and a plurality of second-order low-pass filters as may be incorporated in the present invention.

The two-pole low-pass-filtered step input and resulting output signals 18,20 are shown in FIG. 7 for the second-order low-pass and all-pass filters. As was the case in FIG. 6, each filter provides a one second signal delay. Again, the all-pass filter output signal $20_A$ defines a slope close to that of the input signal with that of the low-pass filters being slightly lower.

The output signal $20_A$ of the all-pass filter has an initial positive slope which eventually drops off to a negative amplitude and then rises again. Thus two zero-crossings are accomplished. The first zero-crossing is not desirable and is, therefore, disregarded. The second zero-crossing is used in evaluation.

Three low-pass filter outputs $20_{LG,LBS,LBT}$ are shown corresponding to three selected low-pass filters tested. These include the Gaussian, Bessel, and Butterworth low-pass filters. Others may be used as well. The output signals $20_{LG,LBS,LBT}$ generated by the three filters as shown can be seen to be substantially similar.

Figure 8:
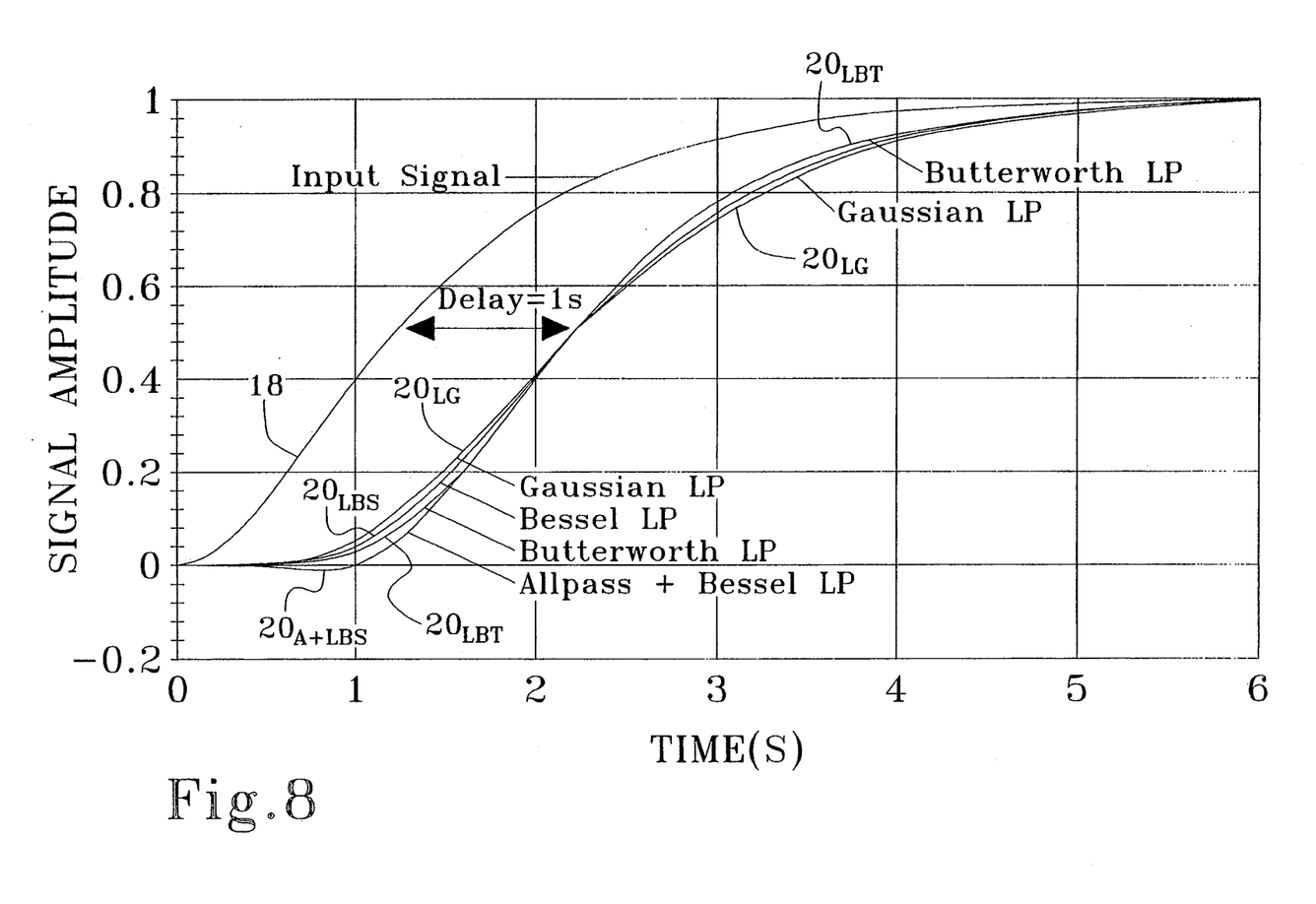
FIG. 8 is a graph illustrating an input signal as compared to output signals of a fourth-order all-pass filter and a plurality of fourth-order low-pass filters as may be incorporated in the present invention.

The two-pole low-pass-filtered step input signals 18 and resulting output signals 20 are illustrated in FIG. 8 for the fourth-order low-pass and all-pass-low-pass filters 10. The all-pass-low-pass filter 10 consists of a second-order all-pass filter combined with a second-order low-pass filter. The second-order low-pass filter is designed to minimize the initial positive-going signal distortion that is present at the output of the second-order all-pass filter as shown in FIG. 7.

Each fourth-order filter response provides a one second signal delay. The all-pass-low-pass filter output signal slope is close to that of the input signal 18, as was the all-pass filter for the first- and second-order all-pass filters. It can be seen that the differences between the output signals of the various low-pass filters is more pronounced in the fourth-order filters as opposed to the second-order filters.

As was true for the first- and second-order filters, the gain of all fourth-order filters is unity at DC, but the gain begins to fall off for all of the filters at frequencies above the cutoff frequency. The gain roll-off occurs for the all-pass-low-pass filter combination because of the gain roll-off in the low-pass filter.

A careful review of FIGS. 4-6 reveals that the low-pass filter output signal slope increases with the filter order. Though not discussed, the output signal slope is maximum among the low-pass filters for those that are the least damped (the Butterworth low-pass filters) and is minimum for the most damped filters (the Gaussian filters).

One of the preferred low-pass filters is the Gaussian filter due to its simplicity. Gaussian filters have real poles with equal critical frequencies and do not require state-variable or biquad second-order filter sections typically required for other low-pass filters such as the Bessel and Butterworth filters mentioned above.

The group delay of an n-th order Gaussian low-pass filter is approximated by:

$$t_d = n t_p$$

where n is the filter order (the number of poles) and $t_p$ is the time constant associated with each pole. The effective time constant (relating to the low-pass filter bandwidth) of the filter is approximated by:

$$t_{BW} = n^{\frac{1}{2}} t_p.$$

The delay-bandwidth product of the filter may be approximated by:

$$t_{d\omega-3db} \approx t_d / t_{BW} \approx (n t_p)/(n^{\frac{1}{2}} t_p) \approx n^{\frac{1}{2}}.$$

For time domain analysis, it is more useful to consider the filter delay time to rise time ratio, which is closely related to the delay-bandwidth product and is approximated by:

$$t_d / t_{r(10-90\%)} \approx t_d / 2.2 t_{BW} \approx (n^{\frac{1}{2}})/2.2.$$

Both the delay-bandwidth product and the delay time to rise time ratio increase as the square-root of the number of poles. The increase over a single pole filter is approximately a factor of 1.4 for a two-pole filter, 2.0 for a four-pole filter, and 3.2 for a ten-pole filter. Thus, the improvement increases at a diminishing rate as the number of filter poles continues to increase.

The Gaussian low-pass filters incorporated in the delay path have Laplace transfer functions given by:

$$D(s) = [n^{\frac{1}{2}} \omega_d]^n / [s + n^{\frac{1}{2}} \omega_d]^n$$

where $\omega_d$ is a filter cutoff frequency that is inversely proportional to the desired filter time delay, and n is the filter order. The critical frequency associated with each real pole is increased above the filter cutoff frequency ($\omega_d$) by the $n^{\frac{1}{2}}$ factor shown to maintain nearly constant filter rise time independent of filter order for a given cutoff frequency.

In the amplitude- and rise-time-insensitive timing-shaping filters 10 of the present invention wherein Gaussian low-pass filters are incorporated, the transfer function is given by:

$$H_{cf}(s) = D(s) - f$$

or by:

$$H_{cf}(s) = \{[n^{\frac{1}{2}} \omega_d]^n / [s + n^{\frac{1}{2}} \omega_d]^n\} - f$$

where f is the fraction value. The fraction value is to be constrained to values between zero and unity. The previous equation may be written as:

$$H_{cf}(s) = \{[n^{\frac{1}{2}} \omega_d]^n - f[s + n^{\frac{1}{2}} \omega_d]^n\} / [s + n^{\frac{1}{2}} \omega_d]^n$$

in order to permit study of the pole and zero locations. The transfer function contains the same real poles present in the Gaussian low-pass filter. However, unlike the Gaussian low-pass filter, the transfer function contains a number of zeros equal to the order number of the filter, one of which is a right-half-plane real zero. The DC gain of the transfer function is given by:

$$H_{cf}(dc) = 1 - f$$

which is valid for all low-pass and all-pass delay line approximation filters, of arbitrary type and order, having unity DC gain.

For a first-order Gaussian low-pass filter, the transfer function of the filter 10 is given by:

$$H_{cf(n=1)}(s) = -f\{[s - \omega_d((1-f)/f)]/[s + \omega_d]\}.$$

In this equation there is one pole and one right-half-plane real zero. The pole has the same critical frequency as the low-pass filter pole. The critical frequency for the right-half-plane zero may be selectively adjusted to any real value by selection of the fraction value ($0 < f < 1$) and low-pass filter cutoff frequency ($\omega_d$).

For second-, third-, and fourth-order Gaussian low-pass filters, the transfer functions of the filter 10 are given by:

$$H_{cf(n=2)}(s) = -f\{[s - 2^{\frac{1}{2}}\omega_d((1 - f^{\frac{1}{2}})/f^{\frac{1}{2}})]/[s + 2^{\frac{1}{2}}\omega_d]\} \times$$
$$\{[s + 2^{\frac{1}{2}}\omega_d((1 + f^{\frac{1}{2}})/f^{\frac{1}{2}})]/[s + 2^{\frac{1}{2}}\omega_d]\};$$

$$H_{cf(n=3)}(s) = -f\{[s - 3^{\frac{1}{2}}\omega_d((1 - f^{\frac{1}{3}})/f^{\frac{1}{3}})]/[s + 3^{\frac{1}{2}}\omega_d]\} \times$$
$$\{[s + 3^{\frac{1}{2}}\omega_d((f^{\frac{1}{3}} + 1/2 \pm (j3^{\frac{1}{2}}/2))/f^{\frac{1}{3}})]/[s + 3^{\frac{1}{2}}\omega_d]\};$$

and $$H_{cf(n=4)}(s) = -f\{[s - 4^{\frac{1}{2}}\omega_d((1 - f^{\frac{1}{4}})/f^{\frac{1}{4}})]/[s + 4^{\frac{1}{2}}\omega_d]\} \times$$
$$\{[s + 4^{\frac{1}{2}}\omega_d((1 + f^{\frac{1}{4}})/f^{\frac{1}{4}})]/[s + 4^{\frac{1}{2}}\omega_d]\} \times$$
$$\{[s + 4^{\frac{1}{2}}\omega_d((f^{\frac{1}{4}} \pm j)/f^{\frac{1}{4}})]/[s + 4^{\frac{1}{2}}\omega_d]\};$$

respectively, where n denotes the order of the Gaussian low-pass delay path filter and $\omega_d$ is the delay-line-filter cutoff frequency. The delay-line-filter cutoff frequency is related to the inverse of the delay time constant ($t_d \propto 1/\omega_d$). These transfer functions have been shown as factored in order to identify the pole and zero locations.

Figure 9:
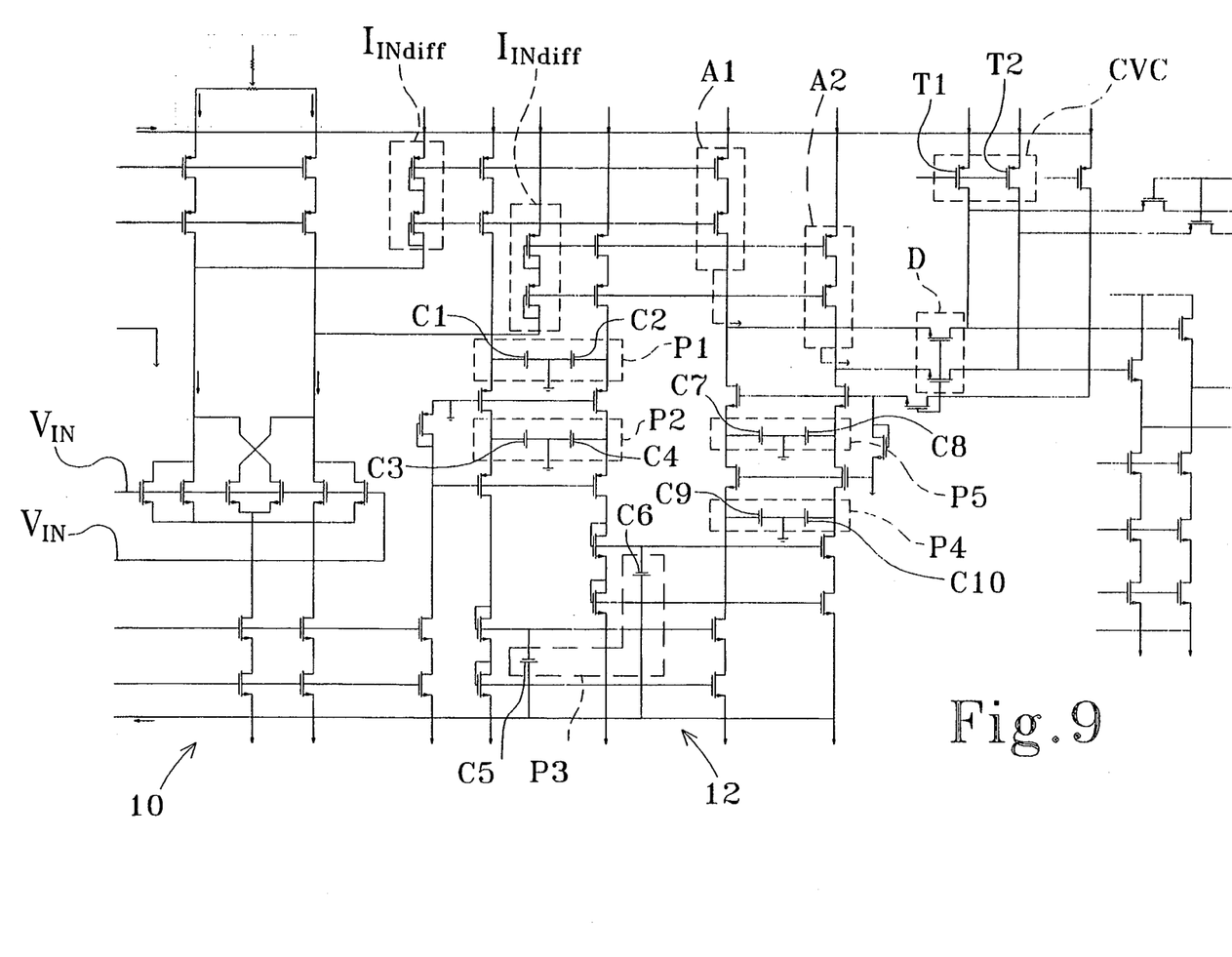
FIG. 9 is a block diagram illustrating the circuitry constructed in accordance with several features of the present invention, the delay line approximation including a five-pole Gaussian low-pass filter.

FIG. 9 illustrates a block diagram of one preferred embodiment of the amplitude- and rise-time-insensitive timing-shaping filter 10. In this illustrated embodiment, the filter 10 includes a five-pole Gaussian low-pass filter in a CMOS fully-differential integrated circuit. As discussed previously, the Gaussian low-pass filter may be replaced with any other selected low-pass filter of a selected order, an all-pass filter of a selected order, or an all-pass-low-pass combination filter.

An input signal is introduced into the filter 10 at $V_{IN}$ and is converted to the differential input currents at $I_{INdiff}$. The signals are then delivered into the two paths. One of the two paths is the attenuation path designated at A1,A2. The attenuated signal is routed to a differencer D.

The input signal is further delivered to the delay path, which essentially consists of the low-pass filter 12. The low-pass filter 12 of the illustrated embodiment includes five poles P1-5. The poles P1-5 are each introduced by a pair of capacitors, one for each differential circuit. Pole P1 is introduced by capacitors C1,2, pole P2 is introduced by capacitors C3,4, pole P3 is introduced by capacitors C5,6, pole P4 is introduced by capacitors C7,10, and pole P5 is introduced by capacitors C7,8. The low-pass filter 12 has two paths due to its differential nature, as does the attenuated path A1,A2. The first path is through capacitors C1,3,5,9,7 and the second path is through capacitors C2,4,6,10,8. The signals are then routed to the differencer D as are the attenuated signals.

The differencer D subtracts the attenuated signal from the delayed signal to generate the desired bi-polar output signal. The output signal may be delivered to a current-to-voltage converter as at CVC. The converter CVC of the illustrated embodiment is comprised of a pair of MOSFET transistors T1,2 which are acting as simple resistors.

The filter 10 has a fraction value f equal to fifty percent (50%). The illustrated circuit has a gain of two (2).

The filter 10 as shown converts input voltages into currents, processes the currents to generate the output signal, and then converts the output currents into voltages. It will be understood that the input signals may be in the form of voltage or current, as may the output signals. The conversions shown are for illustrative purposes only and are not intended to be limitations of the present invention.

Figure 10:
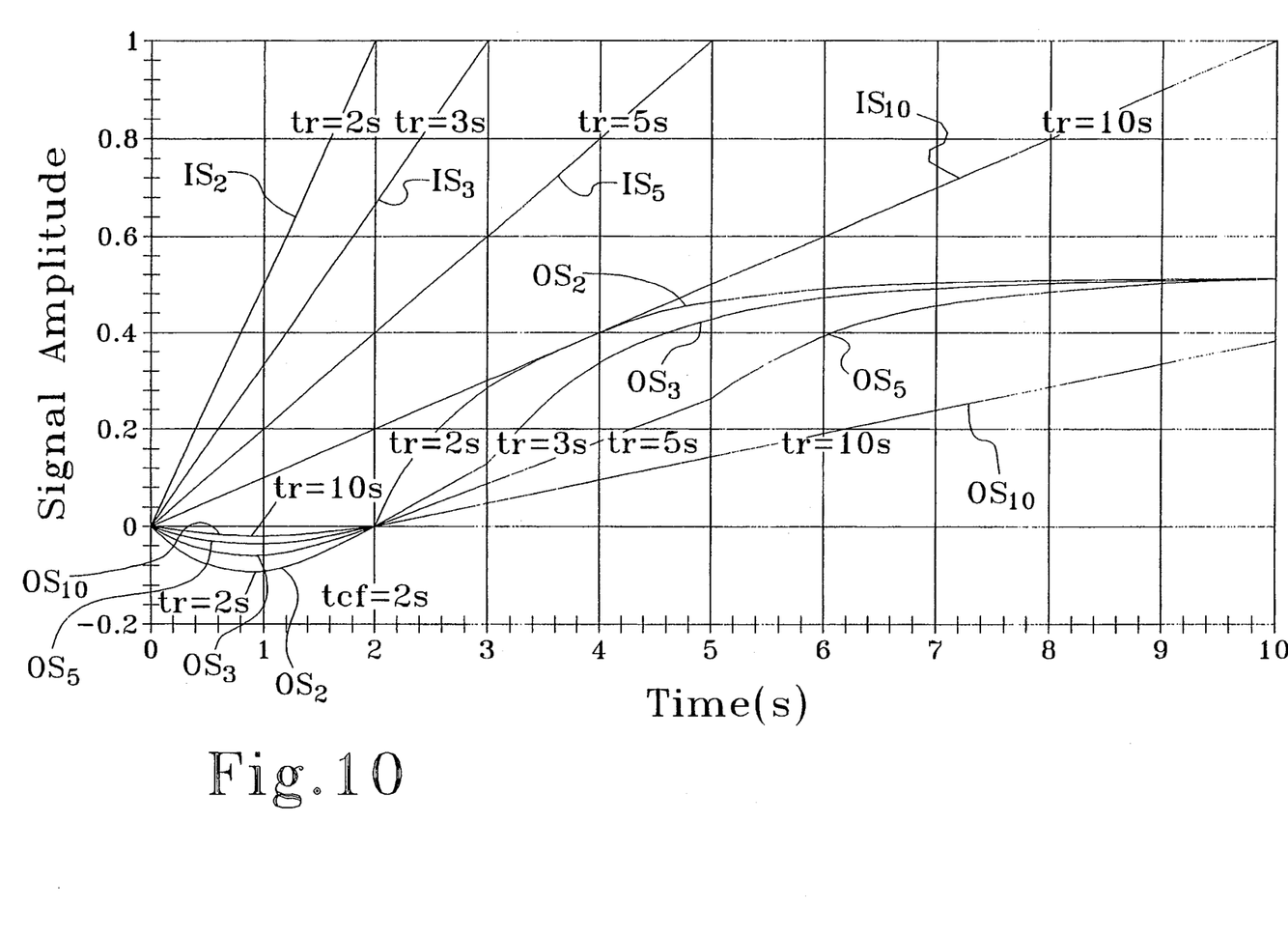
FIG. 10 is a graph illustrating the rise-time insensitivity of the present invention by showing several substantially linear-edge signals having varying rise-times, but each resulting in a bi-polar output signal having substantially similar zero-crossing times.

FIG. 10 is a graph illustrating the rise-time insensitivity of the filter 10 which shows several substantially linear-edge signals $IS_{2,3,5,10}$ having varying rise-times. Here, rise-times of 2, 3, 5 and 10 seconds are defined by the respective signals, each having unity amplitude. It may be observed that the corresponding bi-polar output signals $OS_{2,3,5,10}$ each have a zero-crossing of 2 seconds. This is true even though the shorter rise times have stronger underdrives and more aggressive zero-crossing slopes than do the longer rise times.

Figure 11:
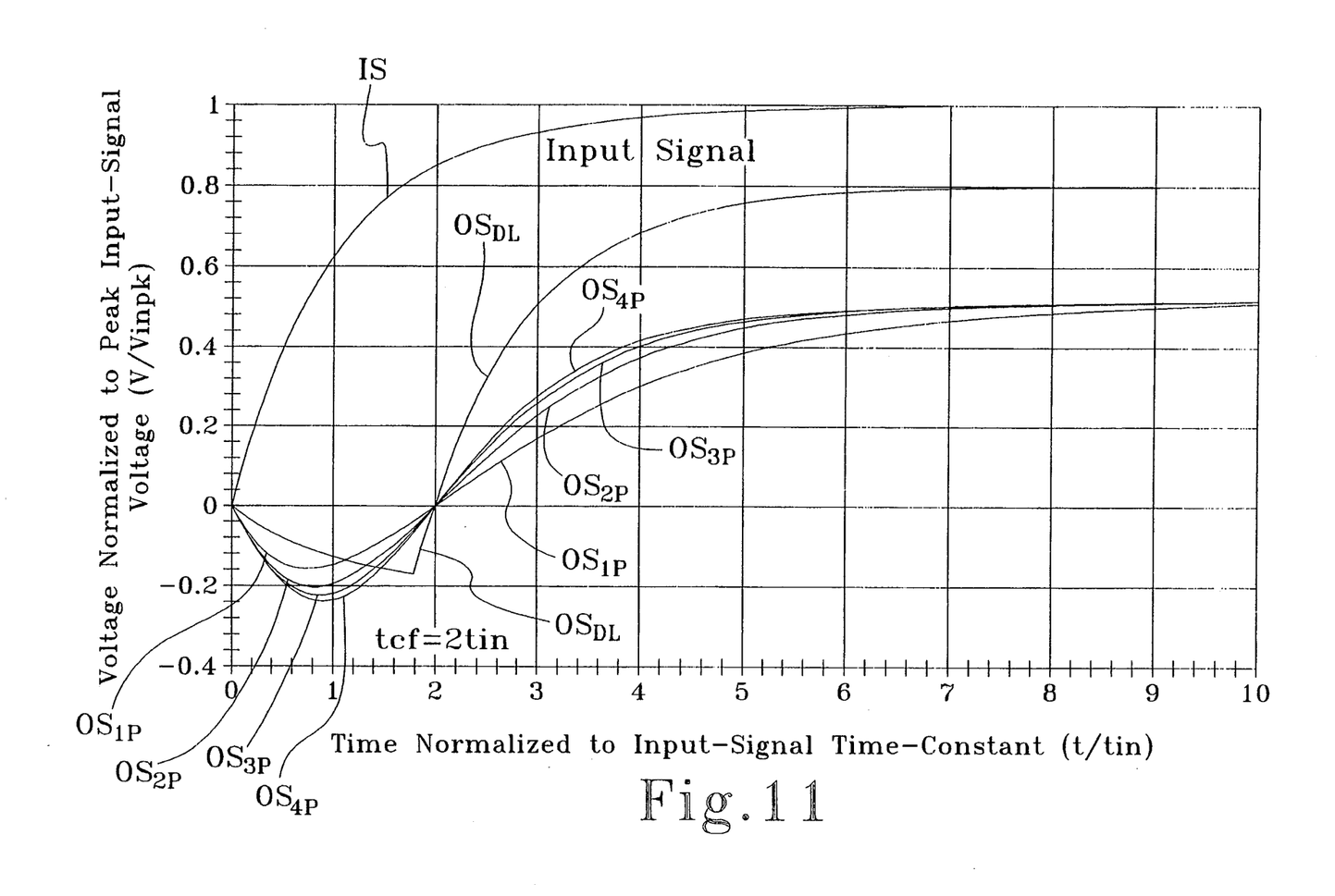
FIG. 11 is a graph illustrating an output signal comparison between several devices constructed in accordance with several features of the present invention and a prior art delay-line constant-fraction discriminator.

FIG. 11 is a graph illustrating an output signal comparison between several filters 10 using various delayed paths 12 and a prior art delay-line constant-fraction discriminator. Shown are the output signals from a delay-line constant-fraction discriminator, designated $OS_{DL}$, and filters 10 incorporating single-, two-, three-, and four-pole Gaussian low-pass filters, designated $OS_{1P,2P,3P,4P}$, respectively. The fraction value, f, of 0.2 was chosen for the delay-line constant-fraction discriminator while f=0.5 was chosen for the filters 10. Here it can be seen that the zero-crossing time, $t_{cf}$, of the delay-line constant-fraction discriminator output signal $OS_{DL}$ is substantially similar to the outputs $OS_{1P,2P,3P,4P}$ of the various filters 10 when introduced with substantially similar input signals.

From the foregoing description, it will be recognized by those skilled in the art that an amplitude- and rise-time-insensitive timing-shaping filter offering advantages over the prior art has been provided. Specifically, the amplitude- and rise-time-insensitive timing-shaping filter provides integrated or discrete circuitry for generating a bi-polar output signal from an input signal using a low-pass or all-pass filter for delaying the input signal for comparison with an attenuated signal. The function of the bi-polar output signal is independent of the rise-time and the amplitude of the input signal for substantially linear-edge input signals with time derivation along the leading edges. The function of the bi-polar output signal is independent of the input signal amplitude for input signals of an arbitrary, fixed shape having a zero-crossing.

While a preferred embodiment has been shown and described, it will be understood that it is not intended to limit the disclosure, but rather it is intended to cover all modifications and alternate methods falling within the spirit and the scope of the invention as defined in the appended claims.

Having thus described the aforementioned invention, I claim:

1. A timing-shaping filter for converting a selected input signal defining a substantially linear edge to a bi-polar signal having a zero-crossing time along said substantially linear edge, said timing-shaping filter being insensitive to the amplitude and rise time of said selected input signal, said timing-shaping filter comprising:

signal delay circuitry for receiving said selected input signal and generating a delayed signal, said signal delay circuitry consisting of one or more low-pass filters;

attenuation circuitry for receiving said selected input signal and generating an attenuated signal, said attenuated signal being a selected fraction of said selected input signal, said attenuator circuitry being connected in parallel to said signal delay circuitry; and a differencer for subtracting said attenuated signal from said delayed signal to generate said bi-polar signal whereby said bi-polar signal defines a zero-crossing time which is independent of said amplitude and said rise time of said selected input signal.

2. A timing-shaping filter for converting a selected input signal defining a substantially linear edge to a bi-polar signal having a zero-crossing time along said substantially linear edge, said timing-shaping filter being insensitive to the amplitude and rise time of said selected input signal, said timing-shaping filter comprising:

signal delay circuitry for receiving said selected input signal and generating a delayed signal, said signal delay circuitry consisting of one or more low-pass filters;

attenuation circuitry for receiving said selected input signal and generating an attenuated signal, said attenuated signal being a selected fraction of said selected input signal, said attenuator circuitry being connected in parallel to said signal delay circuitry, said selected fraction being within the range defined between zero, non-inclusive, and one, non-inclusive; and a differencer for subtracting said attenuated signal from said delayed signal to generate said bi-polar signal whereby said bi-polar signal defines a zero-crossing time which is independent of said amplitude and said rise time of said selected input signal.

3. A timing-shaping filter for converting a selected input signal defining an arbitrary fixed shape to a bi-polar signal having a zero-crossing time, said timing-shaping filter being insensitive to at least the amplitude of said selected input signal, said timing-shaping filter comprising:

signal delay circuitry for receiving said selected input signal and generating a delayed signal, said signal delay circuitry consisting of one or more low-pass filters;

attenuation circuitry for receiving said selected input signal and generating an attenuated signal, said attenuated signal being a selected fraction of said selected input signal, said attenuator circuitry being connected in parallel to said signal delay circuitry; and a differencer for subtracting said attenuated signal from said delayed signal to generate said bi-polar signal whereby said bi-polar signal defines a zero-crossing time which is independent of at least said amplitude of said selected input signal.

4. The timing-shaping filter of claim 3 wherein said selected fraction is within the range defined between zero, non-inclusive, and one, non-inclusive.

5. A timing-shaping filter for converting a selected input signal defining a substantially linear edge to a bi-polar signal having a zero-crossing time along said substantially linear edge, said timing-shaping filter being insensitive to the amplitude and rise time of said selected input signal, said timing-shaping filter comprising:

signal delay circuitry for receiving said selected input signal and generating a delayed signal, said signal delay circuitry including at least one low-pass filter and at least one all-pass filter in series with said at least one low-pass filter;

attenuation circuitry for receiving said selected input signal and generating an attenuated signal, said attenuated signal being a selected fraction of said selected input signal, said attenuator circuitry being connected in parallel to said signal delay circuitry; and a differencer for subtracting said attenuated signal from said delayed signal to generate said bi-polar signal whereby said bi-polar signal defines a zero-crossing time which is independent of said amplitude and said rise time of said selected input signal.

6. The timing-shaping filter of claim 5 wherein said selected fraction is within the range defined between zero, non-inclusive, and one, non-inclusive.

7. A timing-shaping filter for converting a selected input signal defining a substantially linear edge to a bi-polar signal having a zero-crossing time along said substantially linear edge, said timing-shaping filter being insensitive to the amplitude and rise time of said selected input signal, said timing-shaping filter comprising:

signal delay circuitry for receiving said selected input signal and generating a delayed signal, said signal delay circuitry including at least one low-pass filter and at least one all-pass filter in series with said at least one low-pass filter;

attenuation circuitry for receiving said selected input signal and generating an attenuated signal, said attenuated signal being a selected fraction of said selected input signal, said attenuator circuitry being connected in parallel to said signal delay circuitry, said selected fraction being within the range between zero, non-inclusive, and one, non-inclusive; and a differencer for subtracting said attenuated signal from said delayed signal to generate said bi-polar signal whereby said bi-polar signal defines a zero-crossing time which is independent of said amplitude and said rise time of said selected input signal.

8. A timing-shaping filter for converting a selected input signal defining an arbitrary fixed shape to a bi-polar signal having a zero-crossing time, said timing-shaping filter being insensitive to at least the amplitude of said selected input signal, said timing-shaping filter comprising:

signal delay circuitry for receiving said selected input signal and generating a delayed signal, said signal delay circuitry including at least one low-pass filter and at least one all-pass filter in series with said at least one low-pass filter;

attenuation circuitry for receiving said selected input signal and generating an attenuated signal, said attenuated signal being a selected fraction of said selected input signal, said attenuator circuitry being connected in parallel to said signal delay circuitry; and a differencer for subtracting said attenuated signal from said delayed signal to generate said bi-polar signal whereby said bi-polar signal defines a zero-crossing time which is independent of at least said amplitude of said selected input signal.

* * * * *